(12) United States Patent
Nopper et al.

(10) Patent No.: US 8,314,494 B2
(45) Date of Patent: Nov. 20, 2012

(54) METAL CAP LAYER OF INCREASED ELECTRODE POTENTIAL FOR COPPER-BASED METAL REGIONS IN SEMICONDUCTOR DEVICES

(75) Inventors: Markus Nopper, Dresden (DE); Axel Preusse, Radebeul (DE); Robert Seidel, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 206 days.

(21) Appl. No.: 12/355,840

(22) Filed: Jan. 19, 2009

(65) Prior Publication Data

US 2009/0243109 A1 Oct. 1, 2009

(30) Foreign Application Priority Data

Mar. 31, 2008 (DE) .................. 10 2008 016 431

(51) Int. Cl.
*H01L 23/48* (2006.01)
*H01L 23/52* (2006.01)
*H01L 29/40* (2006.01)

(52) U.S. Cl. . 257/764; 257/765; 257/766; 257/E23.145; 257/E21.585; 438/627; 438/672

(58) Field of Classification Search .................. 438/618, 438/622, 625, 627, 675, FOR. 405, FOR. 406, 438/672; 257/758, 762, 763, 765, 766, E23.145, 257/E23.16, E23.169, E23.142, E21.585, 257/764

See application file for complete search history.

(56) References Cited

U.S. PATENT DOCUMENTS

| | | | |
|---|---|---|---|
| 6,258,713 B1* | 7/2001 | Yu et al. ........................ | 438/634 |
| 6,528,409 B1* | 3/2003 | Lopatin et al. ................ | 438/618 |
| 6,573,606 B2* | 6/2003 | Sambucetti et al. .......... | 257/762 |
| 6,908,847 B2* | 6/2005 | Saito et al. .................... | 438/627 |
| 2001/0000575 A1* | 5/2001 | Meuris et al. .................... | 134/2 |
| 2004/0121577 A1* | 6/2004 | Yu et al. ........................ | 438/622 |
| 2004/0253826 A1* | 12/2004 | Ivanov et al. ................. | 438/710 |
| 2006/0252256 A1* | 11/2006 | Weng et al. ................... | 438/637 |

* cited by examiner

*Primary Examiner* — Olik Chaudhuri
*Assistant Examiner* — Quovaunda V Jefferson
(74) *Attorney, Agent, or Firm* — Williams, Morgan & Amerson, P.C.

(57) ABSTRACT

A conductive cap material for a copper region may be provided with enhanced etch resistivity by taking into consideration the standard electrode potential of one or more of the species contained therein. For example, instead of a conventionally used CoWP alloy, a modified alloy may be used, by substituting the cobalt species by a metallic species having a less negative standard electrode potential, such as nickel. Consequently, device performance may be enhanced, while at the same time the overall process complexity may be reduced.

19 Claims, 5 Drawing Sheets

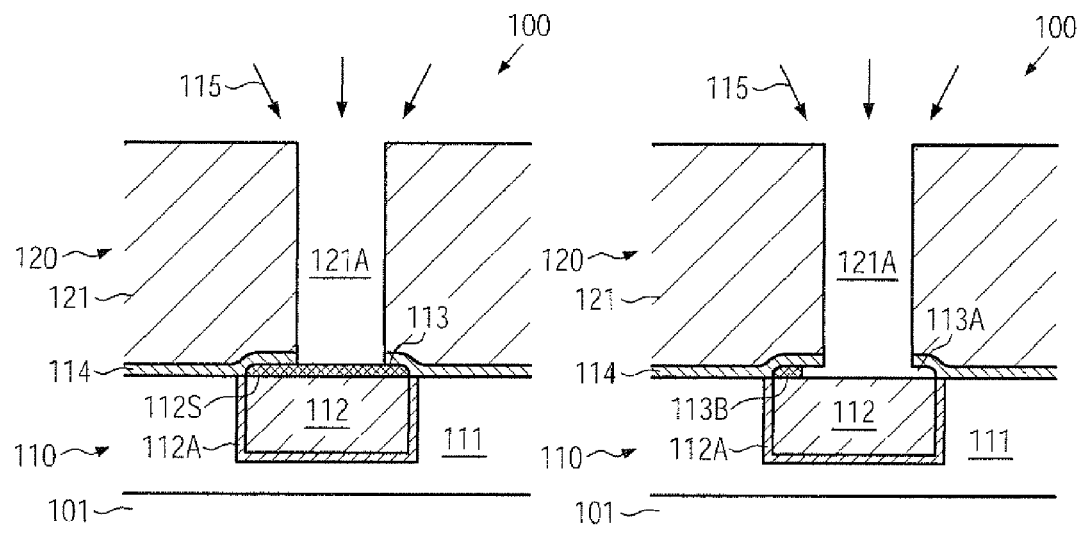
FIG. 1a (prior art)
FIG. 1b (prior art)
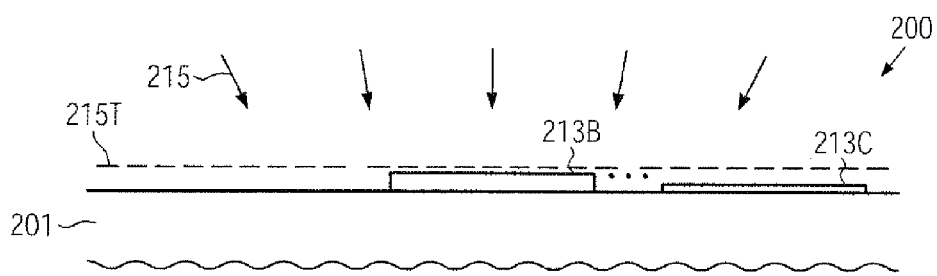
FIG. 2a
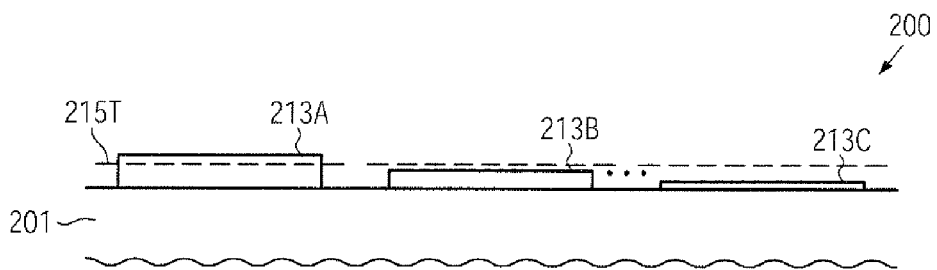
FIG. 2b

METAL CAP LAYER OF INCREASED ELECTRODE POTENTIAL FOR COPPER-BASED METAL REGIONS IN SEMICONDUCTOR DEVICES

BACKGROUND OF THE INVENTION

1. Field of the Invention

Generally, the present disclosure relates to the formation of microstructures, such as advanced integrated circuits, and, more particularly, to the formation of conductive structures, such as copper-based metallization layers, and techniques to reduce electromigration during operation.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these inter-connect lines are also reduced to compensate for a reduced amount of available floor space and for an increased number of circuit elements provided per unit die area, as typically the number of interconnections required increases more rapidly than the number of circuit elements. Thus, a plurality of stacked "wiring" layers, also referred to as metallization layers, is usually provided, wherein individual metal lines of one metallization layer are connected to individual metal lines of an overlying or underlying metallization layer by so-called vias. Despite the provision of a plurality of metallization layers, reduced dimensions of the inter-connect lines are necessary to comply with the enormous complexity of, for instance, modern CPUs, memory chips, ASICs (application specific ICs) and the like. The reduced cross-sectional area of the interconnect structures, possibly in combination with an increase of the static power consumption of extremely scaled transistor elements, may result in considerable current densities in the metal lines, which may even increase with every new device generation.

Advanced integrated circuits, including transistor elements having a critical dimension of 0.05 μm and even less, may, therefore, typically be operated at significantly increased current densities of up to several kA per $cm^2$ in the individual interconnect structures, despite the provision of a relatively large number of metallization layers, owing to the significant number of circuit elements per unit area. Operating the interconnect structures at elevated current densities, however, may entail a plurality of problems related to stress-induced line degradation, which may finally lead to a premature failure of the integrated circuit. One prominent phenomenon in this respect is the current-induced mass transport in metal lines and vias, also referred to as "electromigration." Electromigration is caused by momentum transfer of electrons to the ion cores, resulting in a net momentum in the direction of electron flow. In particular at high current densities, a significant collective motion or directed diffusion of atoms may occur in the interconnect metal, wherein the presence of respective diffusion paths may have a substantial influence on the displaced amount of mass resulting from the momentum transfer. Thus, electromigration may lead to the formation of voids within and hillocks next to the metal interconnect, thereby resulting in reduced performance and reliability or complete failure of the device. For instance, aluminum lines embedded into silicon dioxide and/or silicon nitride are frequently used as metal for metallization layers, wherein, as explained above, advanced integrated circuits having critical dimensions of 0.1 μm or less, may require significantly reduced cross-sectional areas of the metal lines and, thus, increased current densities, which may render aluminum less attractive for the formation of metallization layers.

Consequently, aluminum is being replaced by copper and copper alloys, a material with significantly lower electrical resistivity and improved resistance to electromigration even at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an inter-layer dielectric material is less then desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed to separate the bulk copper from the surrounding dielectric material, thereby reducing copper diffusion into the dielectric materials and also reducing the diffusion of unwanted species, such as oxygen, fluorine and the like, into the copper. Furthermore, the conductive barrier layers may also provide highly stable interfaces with the copper, thereby reducing the probability for significant material transport at the interface, which is typically a critical region in view of increased diffusion paths. Currently, tantalum, titanium, tungsten and their compounds with nitrogen and silicon and the like are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not be readily deposited in larger amounts by chemical and physical vapor deposition techniques, in addition to the fact that copper may not be efficiently patterned by anisotropic dry etch processes, thereby requiring a process strategy that is commonly referred to as the damascene or inlaid technique. In the damascene process, first a dielectric layer is formed which is then patterned to include trenches and/or vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 μm or even less, in combination with trenches having a width ranging from 0.1 μm to several μm. Electrochemical deposition processes for copper are well established in the field of electronic circuit board fabrication. However, the void-free filling of high aspect ratio vias is an extremely complex and challenging task, wherein the characteristics of the finally obtained copper-based interconnect structure significantly depend on process parameters, materials and geometry of the structure of interest. Since the geometry of interconnect structures is substantially determined by the design requirements and may, therefore, not be significantly altered for a given microstructure, it is of great importance to estimate and control the impact of materials, such as conductive and non-conductive barrier layers, of the copper microstructure and their mutual interaction on the characteristics of the interconnect structure so as to insure both high yield and the required product reliability. In particular, it is important to identify, monitor and reduce degradation and failure mechanisms in interconnect structures for various configurations to maintain device reliability for every new device generation or technology node.

Accordingly, a great deal of effort has been made in investigating the degradation of copper interconnects, especially in combination with low-k dielectric materials having a relative permittivity of 3.1 or even less, in order to find new materials and process strategies for forming copper-based lines and vias with a low overall permittivity. Although the exact mechanism of electromigration in copper lines is still not quite fully understood, it turns out that voids positioned in and on sidewalls and especially at interfaces to neighboring materials may have a significant impact on the finally achieved performance and reliability of the interconnects.

One failure mechanism, which is believed to significantly contribute to a premature device failure, is the electromigration-induced material transport, particularly along an interface formed between the copper and a dielectric cap layer, which may be provided after filling in the copper material in the trenches and via openings, the sidewalls of which are coated by the conductive barrier materials. In addition to maintaining copper integrity, the dielectric cap layer may usually act as an etch stop layer during the formation of the via openings in the interlayer dielectric. Frequently used materials are, for example, silicon nitride and silicon carbon nitride, which exhibit a moderately high etch selectivity to typically employed interlayer dielectrics, such as a plurality of low-k dielectric materials, and also suppress the diffusion of copper onto the interlayer dielectric. Recent research results seem to indicate, however, that the interface formed between the copper and dielectric cap layer is a major diffusion path for material transport during operation of the metal interconnect.

Consequently, a plurality of alternatives have been developed in an attempt to enhance the interface characteristics between the copper and the cap layer having the capability of reliably confining the copper and maintaining its integrity. For example, it has been proposed to selectively provide conductive materials on top of the copper-containing region, which may exhibit superior electromigration performance while not unduly reducing the overall resistance of the corresponding metal line. For instance, a compound of cobalt/tungsten/phosphorous (CoWP) has proven to be a promising candidate for conductive cap layers, which may significantly reduce electromigration effects within a corresponding metal line.

Although the compound of cobalt/tungsten/phosphorous provides superior electro-migration performance and may be efficiently implemented into the overall process flow for manufacturing complex metallization systems, since this compound may be readily deposited on the basis of selective electrochemical deposition recipes, it turns out, however, that severe defects may be observed during the patterning of vias connecting to metal regions having formed thereon the cobalt/tungsten/phosphorous cap layer, as will be described in more detail with reference to FIGS. 1a-1b.

FIG. 1a schematically illustrates a cross-sectional view of a semiconductor device 100 at an advanced manufacturing stage, i.e., during a manufacturing sequence for forming a metallization system. The semiconductor device 100 comprises a substrate 101, which may include circuit elements (not shown) according to the specific circuit configuration of the device 100. The semiconductor device 100 may further comprise a first metallization level 110 and a second metallization level 120. As previously explained, the metallization layer 110 may comprise a dielectric material 111, for instance in the form a low-k dielectric material, in which is formed a metal line 112 comprised of copper, in combination with a barrier layer 112A, for instance in the form of tantalum nitrite, tantalum and the like. Moreover, a top surface 112S of the metal region 112 has formed thereon a conductive cap layer 113 comprised of the ternary alloy cobalt/tungsten/phosphorous (CoWP). Furthermore, a dielectric etch stop layer 114, for instance in the form of silicon dioxide, silicon carbide, nitrogen-containing silicon carbide and the like, is formed above the dielectric material 111 and partially above the metal line 112 in contact with the conductive cap layer 113. The further metallization layer 120 comprises, in the manufacturing stage shown, a dielectric material 121 of any appropriate composition, in which is formed a via opening 121A, wherein the dielectric material 121 may represent a lower portion of a dielectric layer stack for the layer 120, if a single damascene strategy is considered, or a trench (not shown) may be formed in the upper portion of the dielectric layer 121.

The semiconductor device 100 as shown in FIG. 1a may be formed on the basis of well-established process techniques, including the formation of circuit elements (not shown) followed by the fabrication of an appropriate contact structure above which a plurality of metallization layers, such as the layers 110, 120 may be formed. For this purpose, the dielectric material 111 may be deposited, for instance, by chemical vapor deposition (CVD) and the like, followed by a patterning sequence for forming an appropriate trench in the layer 110, possibly in combination with respective via openings (not shown), depending on the overall process strategy. A respective etch process for forming a via opening will be discussed with reference to the via opening 121A. Next, the barrier layer 112A may be formed and subsequently the copper material may be filled in, for instance, by electroplating, which may possibly require the deposition of an appropriate seed layer. Thereafter, any excess material of the copper and the barrier layer 112A may be removed, for instance by electrochemical etch techniques, chemical mechanical polishing (CMP) and the like. Subsequently, the exposed surface 112S may be "passiviated" by depositing the conductive cap layer 113, thereby also providing the desired strong interface at the surface 112S in view of superior electromigration performance, as previously discussed. The deposition of the CoWP alloy may be accomplished by electroless plating, during which the exposed surface 112S may act as a catalyst material for initiating the electrochemical reaction when exposed to an appropriate electrolyte solution. Thus, a self-aligned deposition mechanism may be obtained, since the deposition is substantially restricted to the exposed copper surface 112S. After depositing a desired thickness, for instance approximately 10-50 nm, the dielectric etch stop layer 114 may be deposited, for instance, by CVD, followed by the deposition of the dielectric material 121. Next, a complex patterning sequence may be performed, which finally results in the via opening 121A so as to extend down to and into the dielectric etch stop layer 114, which may finally be opened on the basis of well-established etch recipes.

As is well known, during complex plasma-assisted etch processes, a plurality of etch byproducts may be generated, at least some of which may also deposit on exposed surface areas and which may have to be removed prior to a subsequent deposition of a material, such as a conductive barrier material within the opening 121A. Consequently, respective wet chemical etch recipes 115 may be applied, such as diluted hydrofluoric acid, ammonia peroxide mixtures and the like, which have proven to be efficient recipes for conditioning exposed surface portions prior to the further processing of the device 100. Consequently, during the process 115, an exposed portion of the conductive cap layer 113 may come into contact with wet chemical etchant, which, however, may result in undue material removal, thereby substantially completely removing the exposed portion of the cap layer 113 and also creating a significant under-etched area adjacent to the via opening 121A.

FIG. 1b schematically illustrates the semiconductor device 100 after the wet chemical cleaning process 115. As illustrated, a significant under-etching 113A may occur, thereby producing respective voids in the layer stack of the metallization system 120, which may thus result in process non-uniformity during the further processing, thereby also degrading overall performance of the via after filling the same with a barrier material and copper. Consequently, significant efforts have been made to substantially avoid the creation of the under-etched areas 113A, for instance, by finding wet chemical etch chemistries for efficiently cleaning the structure after a plasma-assisted etch process, substantially without attacking the cobalt/tungsten/phosphorous alloy. However, respective wet chemical etch chemistries may suffer from reduced efficiency. In other approaches, a further deposition process for forming the CoWP alloy in the under-etched areas 113A may be used, thereby significantly contributing to the overall cycle time due to a further wet chemical deposition step.

The present disclosure is directed to various methods and techniques that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and respective semiconductor devices in which desired characteristics of an alloy, such as a ternary alloy, with respect to electromigration and copper confinement may be maintained, while nevertheless endowing the alloy with enhanced etch resistivity with respect to well-established wet chemical etch recipes. To this end, the influence of the standard electrode potentials of one or more of the species of the alloy is taken into consideration in order to enhance the overall etch resistivity, while nevertheless providing the desired cap layer characteristics. Thus, by selecting appropriate alloys, such as ternary alloys, for instance a CoWP alloy, and replacing at least one species thereof by a more noble material, i.e., by a material having a less negative standard electrode potential, the resistance against etch attacks of well-established wet chemical recipes may be significantly increased, while nevertheless providing the desired electromigration behavior.

One illustrative semiconductor device disclosed herein comprises a substrate and a metallization system formed above the substrate. The metallization system comprises a metal line formed in a dielectric layer and has a top surface. A conductive cap layer is formed on the top surface and is comprised of a ternary alloy including tungsten and at least one metal defined by a standard electrode potential that is less negative compared to a standard electrode potential of cobalt.

One illustrative method disclosed herein comprises forming an opening in a dielectric layer that is formed above a substrate of a semiconductor device. The method further comprises filling the opening with a copper-containing metal to form a metal region and forming a cap layer comprised of a ternary alloy at least on a top surface of the metal region. The ternary alloy comprises tungsten and at least one metal having a standard electrode potential that is less negative than a standard electrode potential of cobalt.

A further illustrative method disclosed herein comprises identifying a wet chemical cleaning recipe designed for removing contaminants after a plasma etch process for patterning a via opening that connects to a copper-containing metal region in a metallization system of a semiconductor device. The method further comprises determining an etch rate when applying the wet chemical cleaning recipe to one or more ternary alloys. Furthermore, replacing a specified one of the species in the one or more ternary alloys by a substitute species having a less negative standard electrode potential compared to the specified one species, when the etch rate is above a predefined threshold.

BRIEF DESCRIPTION OF THE DRAWINGS

The disclosure may be understood by reference to the following description taken in conjunction with the accompanying drawings, in which like reference numerals identify like elements, and in which:

FIGS. 1a-1b schematically illustrate cross-sectional views of a semiconductor device during the patterning of a dielectric material for forming a via opening connecting to a copper-containing metal region having formed thereon a CoWP cap layer, according to conventional process strategies;

FIGS. 2a-2b schematically illustrate cross-sectional views of test substrates for determining an etch rate of a plurality of ternary alloys during well-established wet chemical cleaning processes in order to study the dependence of the etch rates in view of standard electrode potentials of specific species, according to illustrative embodiments;

Figure 2C:
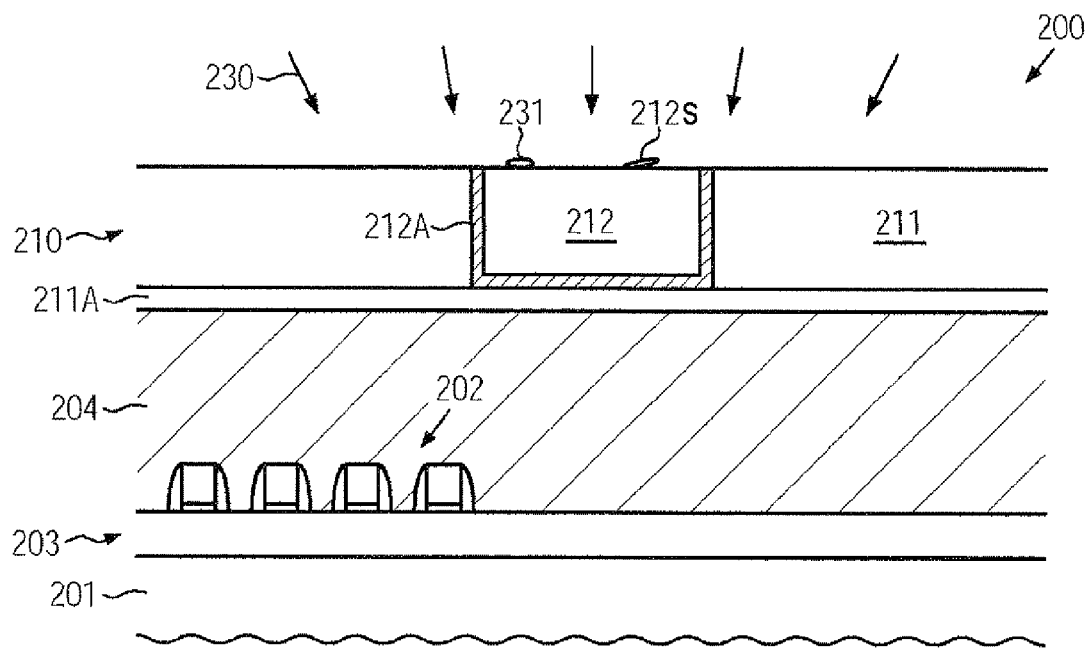
FIGS. 2c-2e schematically illustrate cross-sectional views of a semiconductor device during various manufacturing stages in forming a conductive cap layer as a ternary alloy including tungsten and at least one metal having a more noble behavior compared to cobalt, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques in which well-established wet chemical etch recipes may be used during the patterning of sophisticated metallization systems by taking into consideration the effect of the more or less noble behavior of respective metal species in conductive cap layer materials comprised of alloys, such as ternary alloys, which may provide superior electromigration performance. According to the principles disclosed herein, thus, a significant increase of the etch resistivity which respect to standard wet chemical cleaning solutions may be achieved by substituting one or more of the species of a respective alloy, wherein, in illustrative embodiments, a ternary alloy on the basis of tungsten and phosphorous may be appropriately prepared, for instance, by adding a further metal species having a less negative standard electrode potential compared to the usually used cobalt. As is well known, a standard electrode potential of a specific species is to be understood as the voltage created across an electrode immersed into a solution containing ions of the respective electrode material at a concentration of one mol per liter, wherein the measurement is performed under standard conditions. This standard electrode potential is an indicator of the redox potential, which, in turn, is a measure of or quantitatively describes the ability of ions of a respective species to accept electrons. For example, the ions of noble metals may accept electrons more easily compared to less noble metals, which is quantitatively indicated by a more positive value of the respective standard electrode potential. That is, if a specified metal, such as cobalt, has a negative standard electrode potential, for instance cobalt has a standard electrode potential of −2.13 volt, any metal having a less negative value in its standard electrode potential, may be considered as a more noble metal, which may in combination with other metals result in a significantly different etch behavior with respect to wet chemical etch recipes.

For example, a plurality of ternary alloys may be used as conductive cap layers for copper-based metal regions, thereby providing superior electromigration performance, wherein, according to the present disclosure, the etch resistivity may be enhanced while substantially maintaining the desired electromigration characteristics or even enhancing the overall performance when substituting one of the species by a metal of a more noble characteristic. In one illustrative embodiment disclosed herein, the well-established ternary alloy CoWP may be used as a basis for replacing one or more of the species contained therein with a metal species having a significantly enhanced noble characteristic compared to cobalt. For instance, the cobalt species may be replaced by nickel, which has a standard electrode potential of −0.257V, which may thus significantly enhance the overall characteristics of the resulting nickel/tungsten/phosphorous alloy in view of etch resistivity, while providing even superior electrical characteristics. Consequently, a high degree of compatibility with conventional strategies may be obtained, since well-established wet etch chemistries may be used, while the overall process complexity may also be maintained at a lower level compared to conventional approaches, in which an additional deposition step may be used for refilling under-etched areas.

FIG. 2a schematically illustrates a cross-sectional view of a substrate 201, which may represent any appropriate carrier material for forming thereon one or more material layers 213B, 213C that may represent appropriate materials for acting as a conductive cap layer for a copper-based metal region, as previously explained. For example, the one or more conductive cap layer materials 213B, 213C may represent alloys, and in one particular embodiment, ternary alloys, whose characteristics with respect to etch resistivity for well-established wet chemical etch recipes during a respective etch process 215 may be examined. For example, for one specified standard wet chemical etch process 215, a plurality of different material compositions in the form of, for instance, ternary alloys, 213B, 213C may be provided above the substrate 201 or may be provided on individual substrates in order to determine the material removal under specified process conditions. For example, the removal rate may be determined by providing a specified layer thickness for each of the materials 213B, 213C and determining a respective layer thickness after a specified etch time. In view of the processing of actual products, i.e., in view of performing a wet chemical cleaning process on the basis of the process recipe 215 during the patterning of a dielectric layer of a metallization system, a maximum allowable material removal may be determined, which may be considered as a threshold for deciding whether or not one or more of the conductive cap layer materials 213B, 213C may represent appropriate candidates for actual products. In FIG. 2A, a respective threshold of the removal rate in terms of the remaining layer thickness may be indicated by the dashed line 215T. Consequently, after the wet chemical process 215, respective thickness values may be determined on the basis of well-established techniques and hence respective ones of the materials 213B, 213C may be identified, which may provide the desired low etch rate during the process 215. For instance, if one or more materials are identified to have a too high etch rate, such as CoWP, i.e., if the removal rate is too high, one or more of the species contained therein may be replaced by a metal having a more noble characteristic so as to change the overall etch behavior. For example, for the specified recipe 215, the material 213B may represent the well-established CoWP alloy, which may turn out to have an inappropriately high etch rate, as is also explained with reference to the device 100 when referring to actual product substrates. In this case, in one illustrative embodiment, a ternary alloy may be used, in which tungsten and phosphorous may be maintained, while a more noble metal species may be used instead of cobalt. In one illustrative embodiment, a nickel/tungsten/phosphorous alloy may be used, while, in other cases, other more noble metals may be employed for replacing cobalt or one or more of the other species, such as aluminum, titanium, gold, silver, platinum and the like.

FIG. 2b schematically illustrates the substrate 201 in which a material 213A may now be provided in the form of a ternary alloy including at least one metal species having a less negative standard electrode potential than cobalt, wherein, in one illustrative embodiment, the other components, that is tungsten and phosphorous, may be maintained. As illustrated, after performing the process 215, the materials 213B, 213C, which may represent inappropriate conductive cap layer materials, may have a significantly reduced remaining layer thickness, thereby indicating that the respective removal rate is above the threshold as indicated by the layer thickness 215T. On the other hand, the alloy 213A including the metal species of increased noble behavior may have a remaining layer thickness that is above the layer thickness 215T, thereby indicating that the removal rate is below the predetermined required threshold and hence the material 213A may be selected as an appropriate conductive cap layer material.

It should be appreciated that other characteristics, such as overall conductivity, crystalline structure, copper diffusion blocking effect and the like, may be examined prior to actually selecting the material 213A as an appropriate candidate. For instance, a nickel/tungsten/phosphorous alloy (NiWP) may exhibit superior characteristics, such as a high degree of interface stability in combination with copper and a plurality of conductive barrier materials, such as tantalum nitride, tantalum and the like. That is, upon a direct contact of the NiWP alloy with copper or a conductive barrier material, an interdiffusion may be sufficiently suppressed even at moderately high temperatures up to several hundred degrees, thereby maintaining a strong interface, which may result in enhanced electromigration performance, as previously explained. Thus, the NiWP alloy may act as an efficient barrier material, wherein the substantially amorphous structure after deposition may transition into a nano-crystalline texture upon annealing at temperatures up to 400° C., which may result in an increased conductivity of the NiWP alloy.

It should be appreciated that the respective tests may also be performed with other potential conductive cap layer materials, after an enhanced etch resistivity has been determined for one or more of the desired wet chemical etch recipes.

With reference to FIGS. 2c-2h, further illustrative embodiments will now be described, in which a conductive cap layer material having enhanced etch resistivity may be used, which may be identified, for instance, by the techniques described above, so as to obtain the required electromigration performance and a high degree of compatibility with well-established wet chemical cleaning recipes.

FIG. 2c schematically illustrates a cross-sectional view of a semiconductor device 200 comprising a substrate 201, above which may be formed a device level 203. The substrate 201 may represent any appropriate carrier material for forming thereon and thereabove the device layer 203, which may represent a semiconductor material, such as a silicon-based material and the like, in and above which a plurality of circuit elements, such as transistors 202, may be formed in accordance with design rules. For example, as previously explained, in sophisticated applications, the transistor elements 202 may have critical dimensions of approximately 50 nm and less. It should be appreciated that a critical dimension may be understood as a minimum dimension that has to be reliably formed in the device level under consideration to obtain a specified performance. For example, the length of a gate electrode structure may represent a critical dimension of the transistors 202. Above the device level 203, any other appropriate further levels may be provided, for instance, a contact structure (not shown) designed to connect respective contact areas of the circuit elements 202 with one or more metallization layers 210 in accordance with the specified circuit configuration. The metallization layer 210 may comprise a dielectric material 211, possibly in combination with appropriate cap layers or etch stop materials 211A. An appropriate material composition for the dielectric material 211 and the cap layer 211A may be selected according to similar criteria, as is also previously explained with reference to the device 100. Furthermore, a metal region 212 comprising copper may be embedded in the dielectric material 211, possibly in combination with an appropriate barrier material 212A, as also previously discussed.

The semiconductor device 200 as shown in FIG. 2c may be formed on the basis of well-established process techniques in accordance with the specified design rules. Furthermore, the metallization layer 210 may be formed by process techniques as also described above when referring to the metallization layer 110 of the device 100. Moreover, after forming the copper-containing metal region 212, an exposed surface thereof 212S, as well as other exposed surface areas of the dielectric material 211, may be subjected to a cleaning process 230 in view of any appropriate contaminants, which may have been created during the preceding processing, in particular during a CMP process that may usually be employed for removing excess material and planarizing the resulting surface topography. For example, respective contaminants 231 may have been formed. The cleaning process 230 may be performed on the basis of well-established recipes, thereby also preparing the surface 212S for a subsequent electrochemical deposition process.

Figure 2D:
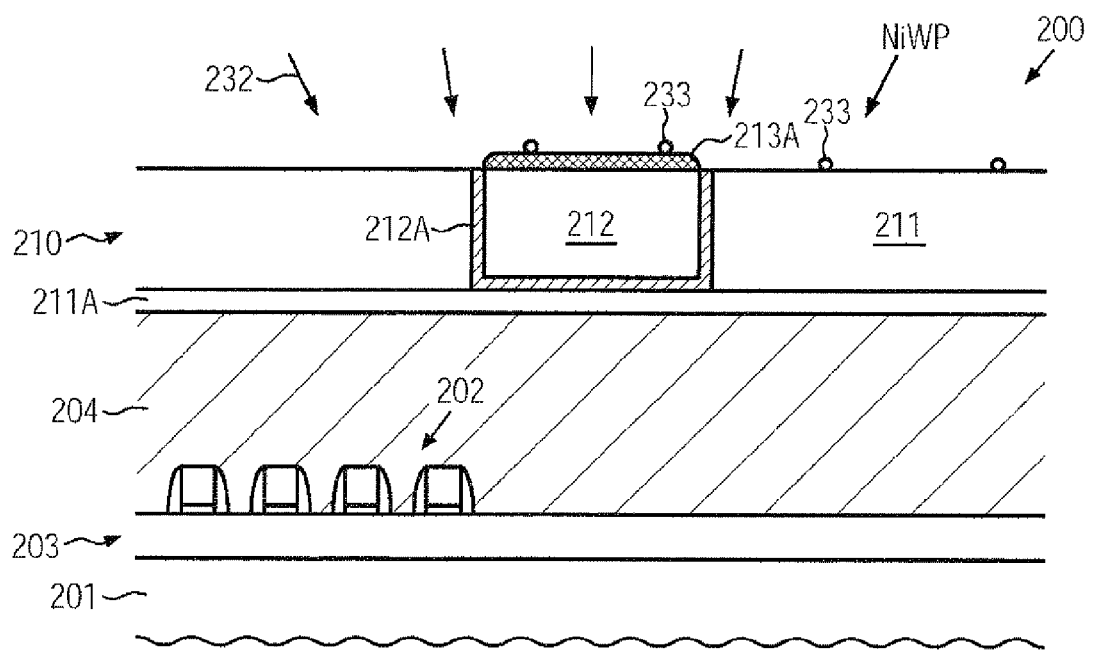

FIG. 2d schematically illustrates the semiconductor device 200 after the cleaning process 230 and during an electrochemical deposition process 232, which may be performed on the basis of an appropriate electrolyte solution including ions of the desired species, wherein, in one illustrative embodiment, a ternary alloy in the form of nickel/tungsten/phosphorous may be deposited. It should be appreciated that electrochemical deposition recipes are well established in the art and may be used for the process 232, in particular as tungsten, phosphorous and nickel are frequently used materials, some of which may also be applied by electroless plating, so that the responding deposition reactors and the like may be available without requiring additional resources. During the process 232, a selective deposition of the material layer 213A may be accomplished with a desired thickness so as to comply with the overall device requirements. As illustrated, during the process 232, contaminants 233 may be created on exposed surface portions, for instance on the dielectric material 211, which may be removed during a subsequent cleaning process.

Figure 2E:
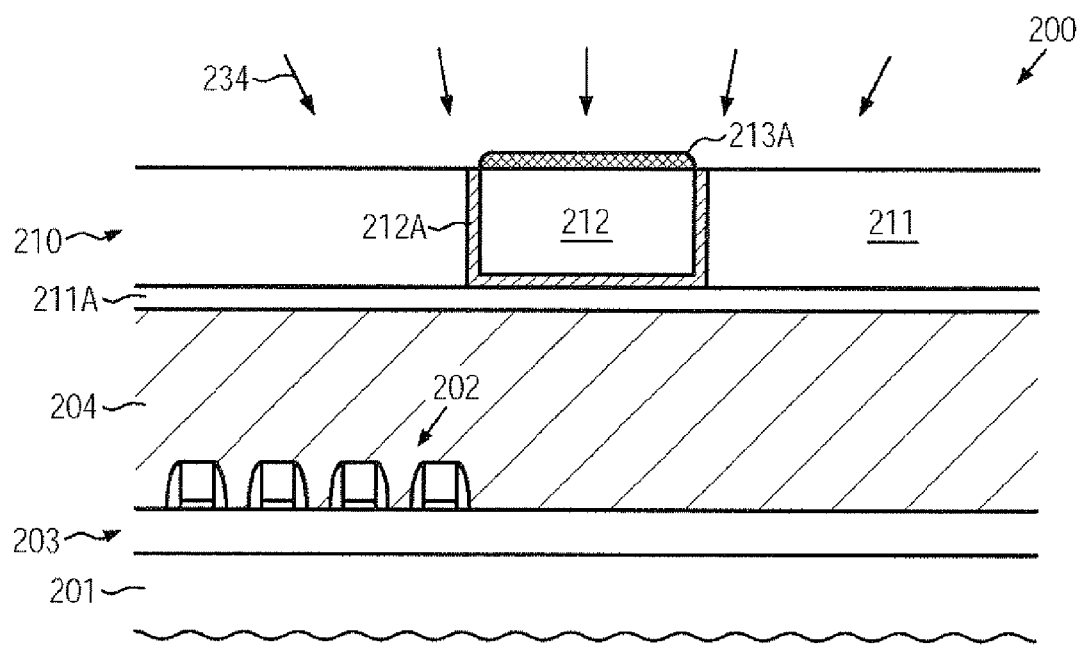

FIG. 2e schematically illustrates the semiconductor device 200 during a corresponding cleaning process 234, which may be performed as any appropriate wet chemical cleaning process including purging with de-ionized water and the like. It should also be appreciated that, due to the enhanced etch resistivity, the cleaning process 234 may comprise standard cleaning chemistries, without significantly damaging the cap layer 213A.

Figure 2F:
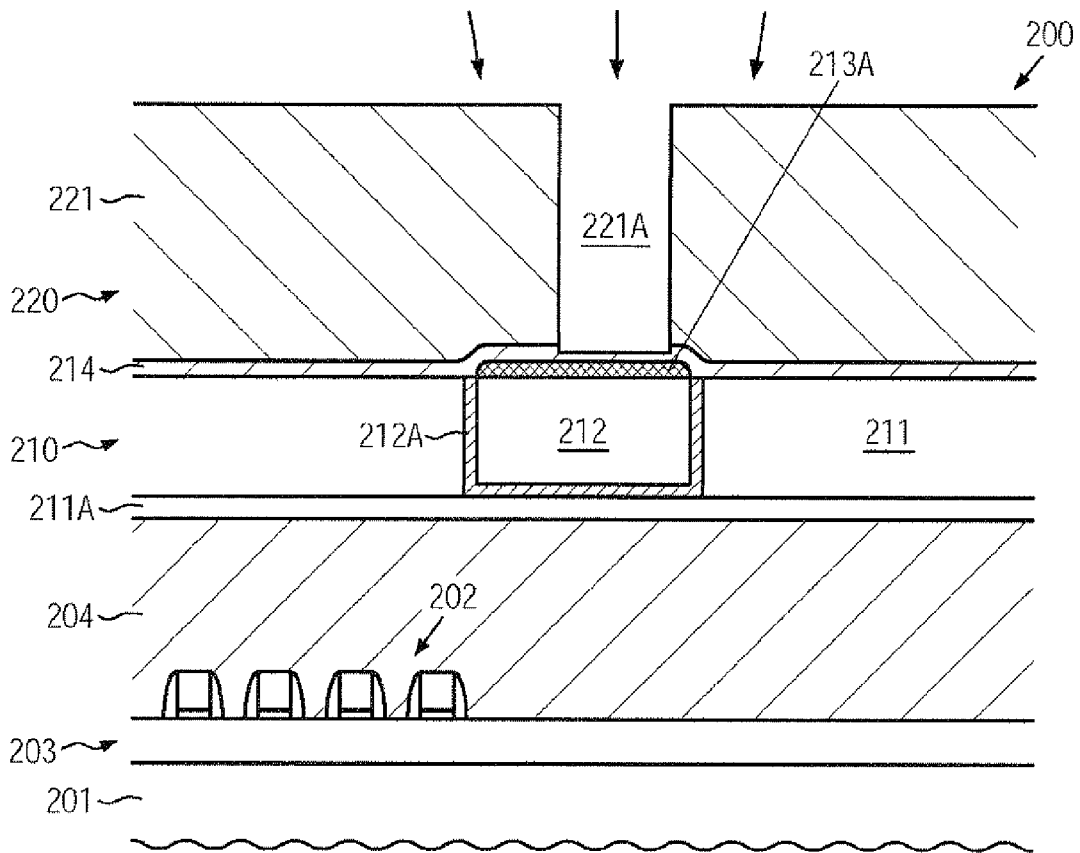
FIGS. 2f-2h schematically illustrate cross-sectional views of the semiconductor device during the further processing for patterning a subsequent metallization level on the basis of plasma-assisted etch processes in combination with a wet chemical cleaning process using well-established recipes, according to still further illustrative embodiments.

FIG. 2f schematically illustrates the semiconductor device 200 in a further advanced manufacturing stage. As illustrated, a dielectric material 221 of a further metallization layer 220 may be formed above the metallization layer 210. Moreover, a via opening 221A may be formed in the material 221, which may, depending on the overall process strategy, extend to an etch stop layer 214 which may be comprised of any appropriate material, as also described with reference to the etch stop layer 114.

The semiconductor device 200 as shown in FIG. 2f may be formed on the basis of substantially the same process techniques as previous described with reference to the device 100. That is, the etch stop layer 214 may be formed on the basis of any appropriate technique, followed by the deposition of the material 221 and a corresponding patterning regime including plasma-assisted etch processes may be performed.

It should be appreciated that a plurality of different patterning regimes may be used for forming metal lines and vias in the dielectric material 221. For example, when the dielectric material 221 may represent a lower portion of the metallization layer 220, the via opening 221A may be formed so as to extend through the layer 214, thereby exposing the cap layer 213A, as shown. In other cases, in the manufacturing stage shown, a trench may already have been formed in an upper portion of the dielectric material 221 and the via opening 221A, that is a lower portion thereof may be formed commonly with a trench. In one example, it may be assumed that a trench may have to be formed after forming the via opening 221A as illustrated in FIG. 2f, without, however, intending to restrict the scope of the present disclosure to any respective patterning regime.

Figure 2G:
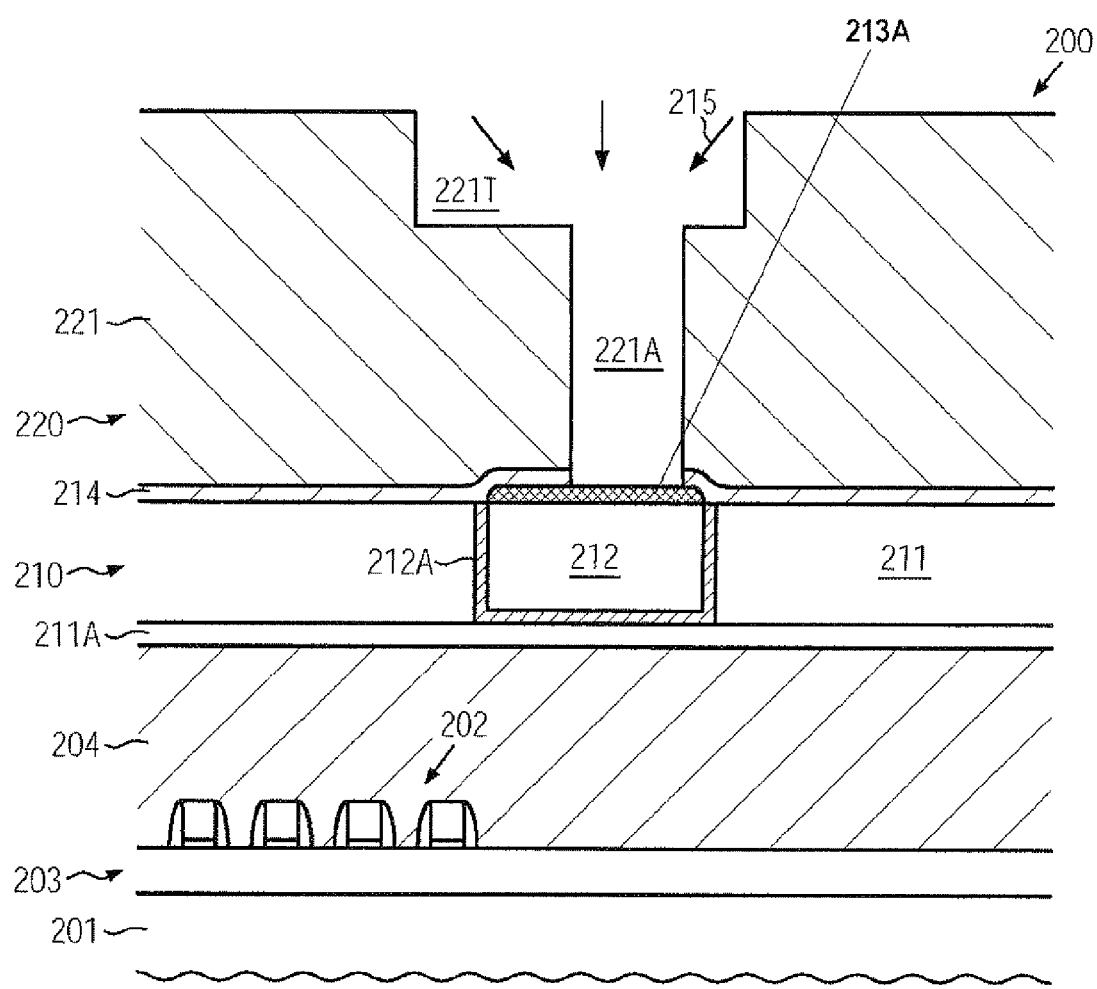

FIG. 2g schematically illustrates the semiconductor device 200 after a further plasma-assisted etch process for forming a trench 221T, which may be accomplished by, for instance, providing a planarization material and forming a trench etch mask by well-established lithography techniques. As previously discussed, in other cases, the trench 221T and the via opening 221A, at least a lower portion thereof, may be formed in a common plasma-assisted etch process. Furthermore, after forming the trench 221T, the etch stop layer 214 may be opened within the via 221A on the basis of well-established etch techniques. Thus, in the manufacturing stage shown, a wet chemical cleaning process, such as the process 215, may be performed to remove etch-related contaminants, as previously explained. Due to the enhanced etch resistivity of the conductive cap layer 213A, which, in one illustrative embodiment, is comprised of nickel/tungsten/phosphorous, a significant material removal may be avoided and also a significant under-etching of the etch stop layer 214 in the vicinity of the via opening 221A may be suppressed.

Figure 2H:
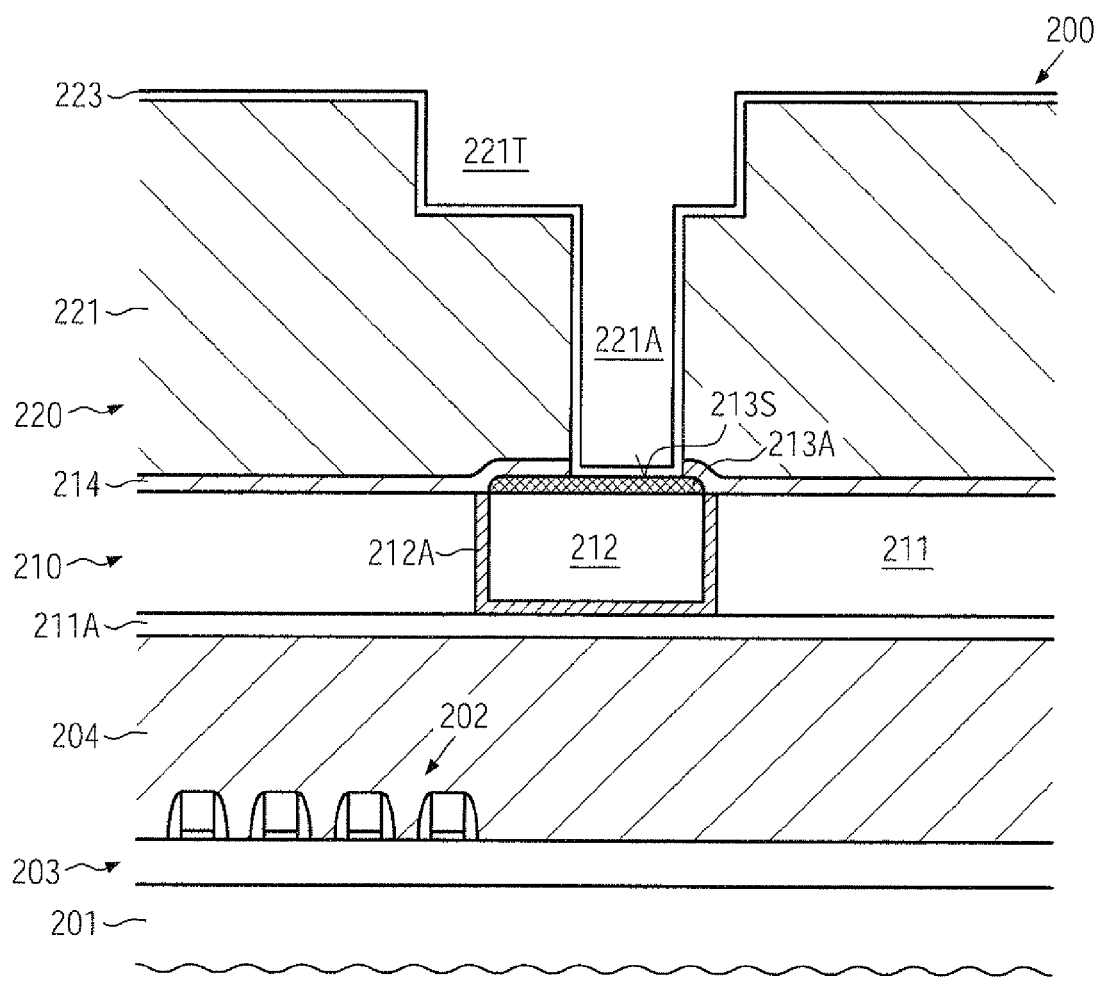

FIG. 2h schematically illustrates the semiconductor device 200 in a further advanced manufacturing stage, in which a conductive barrier layer 223, for instance comprised of tantalum, tantalum nitride, titanium, titanium nitride, or any combinations of two or more of these materials, may be formed in the trench 221T and the via opening 221A. Hence, the barrier material 223 may form an interface with the cap layer 213A, as indicated by 213S, wherein, as previously explained, a high degree of stability may be achieved when, for instance, nickel/tungsten/phosphorous are used for the cap layer 213A.

Thereafter, the further processing may be continued, for instance by filling in copper on the basis of well-established process techniques and removing any excess material thereof. Thereafter, if required, a further conductive cap layer may be formed, for instance comprised of the same material as the layer 213A.

As a result, the present disclosure provides semiconductor devices and respective methods for enhancing etch resistivity of conductive cap layer materials in the form of alloys with respect to well-established wet chemical etch recipes by taking into consideration the standard electrode potential of one or more of the respective species. For example, by identifying an appropriate candidate for a conductive cap material, the etch characteristics thereof may be estimated and may be enhanced by substituting at least one species by a metal that is more noble. For instance, in one illustrative embodiment, in a ternary alloy including tungsten and phosphorous, the third component may be provided in the form of a metal having a less negative standard electrode potential compared to cobalt, thereby providing significantly enhanced etch characteristics. On the other hand, electromigration performance may be maintained at a desired high level, thereby enhancing overall device performance while substantially not contributing to process complexity or even reducing the overall process complexity compared to conventional approaches. In some illustrative embodiments, the cleaning process 215 may be performed under less restrictive conditions due to the enhanced etch resistivity of the material 213A. That is, in some illustrative embodiments, the process 215 may be performed in a standard clean-room atmosphere without requiring the establishment of a substantially oxygen-free process environment. Thus, respective process chambers may have a simple overall structure, thereby also contributing to reduced process complexity. In other cases, less restrictive process conditions may be applied during the processing and handling of the device 200 prior to the cleaning process 215, since even an increased defect rate during these process steps may be efficiently compensated for by using adapted process conditions during the process 215, for instance, by increasing overall process time, increasing concentration of reactive components and the like. Thus, the overall process complexity may further be reduced. The same holds true for preparing, maintaining and supplying the cleaning solution for the process 215, which, in some conventional approaches, may require a substantially oxygen-free ambient during the entire sequence for handling respective wet chemical etch chemistry.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a substrate; and
a metallization system formed above said substrate, said metallization system comprising:
a metal line formed in a dielectric layer and having a top surface, and
a conductive cap layer formed on said top surface, said conductive cap layer being comprised of a ternary alloy including tungsten and at least one metal defined by a standard electrode potential that is less negative compared to a standard electrode potential of cobalt, wherein said at least one metal comprises at least one of aluminum, titanium, gold, silver and platinum.

2. The semiconductor device of claim 1, further comprising a dielectric etch stop layer formed on said conductive cap layer.

3. The semiconductor device of claim 1, further comprising a via formed in a second dielectric layer that is formed above said dielectric layer and said metal line, wherein said via connects to said conductive cap layer.

4. The semiconductor device of claim 3, wherein said via comprises a conductive barrier material that forms an interface with said conductive cap layer.

5. The semiconductor device of claim 1, wherein said ternary alloy comprises phosphorous.

6. The semiconductor device of claim 1, wherein said metal line is comprised of copper.

7. The semiconductor device of claim 1, further comprising transistor elements having a critical dimension of 50 nm or less.

8. The semiconductor device of claim 7, wherein said dielectric material comprises a low-k dielectric material.

9. A method, comprising:
forming an opening in a dielectric layer formed above a substrate of a semiconductor device;
filling said opening with a copper-containing metal to form a metal region; and
forming a cap layer comprised of a ternary alloy at least on a top surface of said metal region, said ternary alloy comprising tungsten and at least one metal having a standard electrode potential that is less negative than a standard electrode potential of cobalt, wherein said at least one metal comprises at least one of aluminum, titanium, gold, silver and platinum.

10. The method of claim 9, wherein said cap layer is formed by performing an electrochemical deposition process.

11. The method of claim 10, wherein said electrochemical deposition process includes an electroless deposition process.

12. The method of claim 9, further comprising cleaning said top surface by a wet chemical cleaning process prior to forming said cap layer.

13. The method of claim 12, further comprising cleaning said cap layer by a wet cleaning process.

14. The method of claim 9, further comprising forming a second dielectric layer above said dielectric layer and said cap layer, forming a via opening in said second dielectric layer that extends at least to said cap layer, and performing a wet chemical cleaning process.

15. The method of claim 14, further comprising depositing a conductive barrier layer in said via opening to form an interface with said ternary alloy of said cap layer.

16. The method of claim 14, wherein said wet chemical cleaning process is performed in the presence of a standard clean room atmosphere.

17. A method, comprising:
performing a plasma etch process to form a via opening in a metallization system of at least one first semiconductor device, said via opening connecting to a first copper-containing metal region in said metallization system;
identifying a wet chemical cleaning recipe designed for removing contaminants from above said first copper-containing metal region after forming said via opening using said plasma etch process;
determining an etch rate when applying said wet chemical cleaning recipe to one or more ternary alloys;
replacing a specified one of the species in said one or more ternary alloys by a substitute species having a less negative standard electrode potential compared to said specified one species when said etch rate is above a predefined threshold; and
for each of a plurality of second semiconductor devices, forming a conductive cap layer above a second copper-containing metal region formed in each of said plurality of second semiconductor devices, said conductive cap layer comprising one of said one or more ternary alloys comprising said substitute species.

18. The method of claim 17, wherein said ternary alloys comprise one of the following materials: a compound comprised of cobalt, tungsten and phosphorous (CoWP); a compound comprised of cobalt, tungsten and boron (CoWB); a compound comprised of nickel, molybdenum and boron (NiMoB); and a compound comprised of nickel, molybdenum and phosphorous (NiMoP).

19. A method, comprising:
forming an opening in a dielectric layer formed above a substrate of a semiconductor device;
filling said opening with a copper-containing metal to form a metal region; and
forming a cap layer comprising a first ternary alloy on at least a top surface of said metal region, wherein said first ternary alloy comprises tungsten and at least one additional metal, and said first ternary alloy has a greater etch resistivity to a wet chemical etch process than a second ternary alloy comprising tungsten and cobalt.

* * * * *